United States Patent
Moore et al.

(10) Patent No.: US 6,201,690 B1
(45) Date of Patent: Mar. 13, 2001

(54) RACK CONSOLE ASSEMBLY

(75) Inventors: Richard E. Moore, Westboro; Stephen G. Finnegan, Franklin, both of MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/144,741

(22) Filed: Sep. 1, 1998

(51) Int. Cl.[7] .............................. H05K 5/00; H05K 7/00; H05K 7/16; A47B 81/00; A47B 97/00
(52) U.S. Cl. ........................ 361/683; 361/681; 361/682; 361/683; 361/724; 361/725; 312/223.1; 312/223.2
(58) Field of Search ...................................... 361/724, 683, 361/682, 727, 681; 312/223.1, 223.2

(56) References Cited

U.S. PATENT DOCUMENTS

| | | | |
|---|---|---|---|
| 5,801,921 | * | 9/1998 | Fujihara ................................ 340/700 |
| 5,896,273 | * | 4/1999 | Varghese et al. ..................... 361/724 |
| 6,025,985 | * | 2/2000 | Leytes et al. ......................... 361/679 |

* cited by examiner

Primary Examiner—Leo P. Picard
Assistant Examiner—Tung Minh Bui
(74) Attorney, Agent, or Firm—Kriegsman & Kriegsman

(57) ABSTRACT

A rack console assembly comprises a rack console and a computer console slidably disposed within the rack console. The computer console is connected to the rack console in such a manner so as to enable the computer console to be collapsably disposed inside of the rack console when in its non-operating mode and so as to enable the computer console to be positioned outside of the rack console when in its operating mode. The computer console comprises a frame which is connected to the rack console, a computer monitor mounted on the frame and a computer keyboard mounted on the frame. The frame is connected to the rack console in such a manner so as to enable the frame to be vertically and horizontally displaced relative to the rack console. The computer monitor is mounted on a support member which is fixedly mounted on a bracket arm pivotally mounted on the frame. The computer monitor is capable of both pivotal displacement relative to the frame and vertical displacement along the support member. The computer console further comprises an end panel pivotally mounted on the frame, the end panel having an inner surface and an outer surface. A pad is affixed to the inner surface of the end panel and serves as a handrest for the computer console when in its operating mode.

19 Claims, 10 Drawing Sheets

RACK CONSOLE ASSEMBLY

BACKGROUND OF THE INVENTION

The present invention relates generally to rack console assemblies and more particularly to rack console assemblies which comprise a computer console.

Computers, such as personal computers, are often connected to a communication network, such as the internet, so as to enable information (i.e., data or files) to be passed from one computer to another computer. When large amounts of information are shared by multiple computers, a network server, or server, is often connected to the communication network to provide information to numerous network clients, or clients.

A server enables many individual clients to access information that is stored within the single server. For example, servers are commonly used to host web sites which can be accessed by many individual computers through the internet.

The establishment of a client-server computer network creates numerous advantages. For example, a client-server relationship enables multiple clients to concurrently access information stored on a single server. In addition, a client-server relationship enables information to be added or modified to the single server rather than to each of the individual clients, thereby reducing the overall cost to maintain the system.

One type of server which is well-known and which is commonly used in commerce is the AViiON dual processor high-density server, model AV20000, which is manufactured by Data General Corporation of Westborough, Massachusetts.

Pluralities of individual servers are often disposed within a rack console, or cabinet, in a stacked relationship. Rack consoles are generally rectangular in shape and are constructed to enable components, such as servers or disc array subsystems, to be slidably disposed therewithin. Rack consoles are typically constructed to house components which have a width which complies with industry NEMA standards (i.e., 19 inches). Rack consoles are also typically constructed to house components which have a height which complies with industry NEMA standards (i.e., a 3-U height of approximately 5.25 inches).

A computer console, which comprises a monitor and a keyboard, is commonly electrically connected to the plurality of individual servers disposed within the rack console in order to enable a computer programmer to add, delete or modify information stored within the servers.

Although the computer console is electrically connected to the individual servers disposed within the rack console, the computer console is often physically located at a position external to the rack console. Specifically, the computer console electrically connected to the individual servers is often mounted on a flat surface proximate to the rack console, such as a nearby table or desk.

One drawback of mounting the computer console on a flat surface proximate to the rack console is that the positioning of the computer console at a location external to the rack console increases the overall size requirement for the system, which is undesirable.

Accordingly, it is well-known for computer consoles to be fixedly disposed within rack consoles. Specifically, a computer console, which comprises a monitor and a keyboard, is often fixedly disposed within the rack console.

One drawback of fixedly disposing a computer console within a rack console is that the computer console is typically large in size and therefore takes up a large percentage of the space of the rack console. As a consequence, the computer console takes up space in the rack console that otherwise would be used to house individual servers, thereby reducing the overall server capabilities of the system, which is undesirable.

Accordingly, it is an object of the present invention to provide a new and improved rack console assembly.

It is also an object of the present invention to provide a rack console assembly which is compact in size.

It is another object of the present invention to provide a rack console assembly as described above which comprises a computer console.

It is yet another object of the present invention to provide a rack console assembly as described above in which the position of the computer console is adjustable.

It is still another object of the present invention to provide a rack console assembly as described above which has a limited number of parts, which is inexpensive to manufacture and which is easy to use.

SUMMARY OF THE INVENTION

Accordingly, there is provided a rack console assembly comprising a rack console, and a computer console slidably disposed within said rack console, said computer console being positionable inside of said rack console when in its nonoperating mode and said computer console being positionable outside of said rack console when in its operating mode.

Various other features and advantages will appear from the description to follow. In the description, reference is made to the accompanying drawings which form a part thereof, and in which is shown by way of illustration, a specific embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

A fuller understanding of the nature and objects of the present invention will become apparent upon consideration of the following detailed description taken in connection with the accompanying drawings, wherein like reference numerals represent like parts.

DETAILED DESCRIPTION OF THE PREFERRED EMBODIMENT

Figure 1:
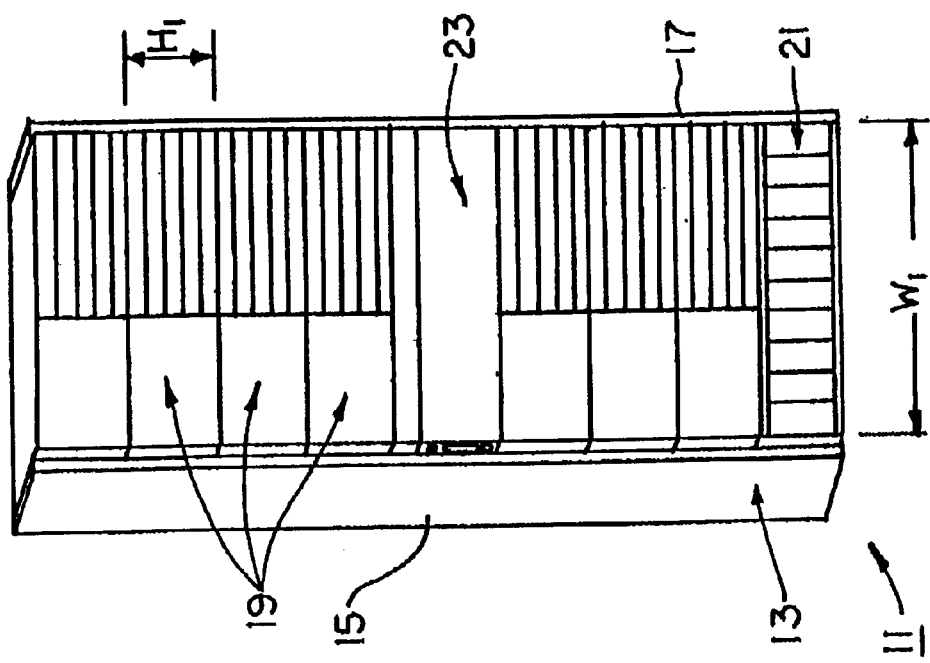
FIG. 1 is a front view of a rack console assembly constructed according to the teachings of the present invention, the computer console being shown disposed in its non-operating position.

Referring now to FIG. 1, there is shown a rack console assembly constructed according to the teachings of the present invention, the rack console assembly being identified generally by reference numeral 11.

Rack console assembly 11 comprises a generally rectangular rack console, or cabinet, 13. Rack console 13 comprises a left side panel 15 and a right side panel 17 and is sized and shaped to house various components therewithin. For example, rack console 13 is shown housing a plurality of servers 19. Servers 19 represent any computer network server. For example, servers 19 may be AViiON dual processor high-density servers, model AV 20000, which are manufactured by Data General Corporation of Westborough, Massachusetts. Rack console 13 is also shown housing a disc array subsystem 21. Disc array subsystem 21 represents any wellknown type of disc array subsystem. For example, subsystem 21 may be a CLARiiON Raid Series 3500 disc array subsystem, which is manufactured by Data General Corporation of Westborough, Massachusetts.

It should be noted that although rack console 13 is shown housing servers 19 and subsystem 21, rack console 13 can house alternate types of components without departing from the spirit of the present invention.

Rack console 13 may be constructed in any size or dimension. However, it is preferred that rack console 13 be constructed to meet NEMA industry size and dimension standards. Specifically, it is preferred that rack console 13 be constructed to house components which have a width $W_1$ of approximately 19 inches. It is also preferred that rack console 13 be constructed to house components which have a height $H_1$ of approximately 5.25 inches (also commonly referred to as a 3-U height in the art).

Figure 2:
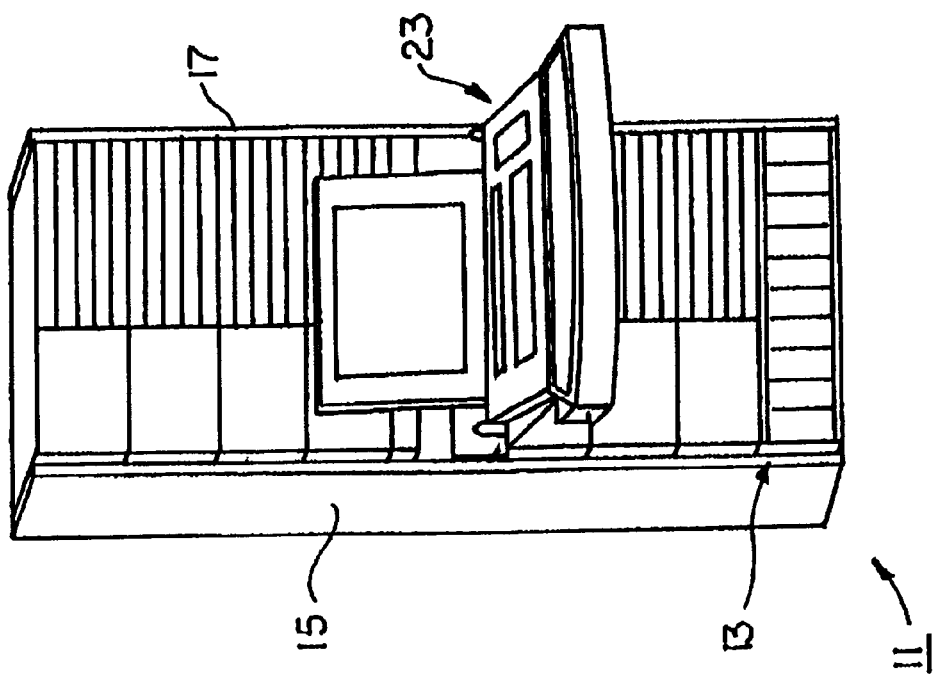
FIG. 2 is a front view of the rack console assembly shown in FIG. 1, the computer console being shown disposed in its operating position.

Rack console assembly 11 further comprises a computer console 23 which is slidably disposed within rack console 13. As will be described in detail below, computer console 23 can be slidably disposed inside of rack console 13 when in its non-operating mode. Disposed within rack console 13, computer console 23 occupies the space designated for only a single component, as shown in FIG. 1. Furthermore, computer console 23 can be slidably withdrawn to a position outside of rack console 13 when computer console 23 is in its operating mode, as shown in FIG. 2.

Figure 3:
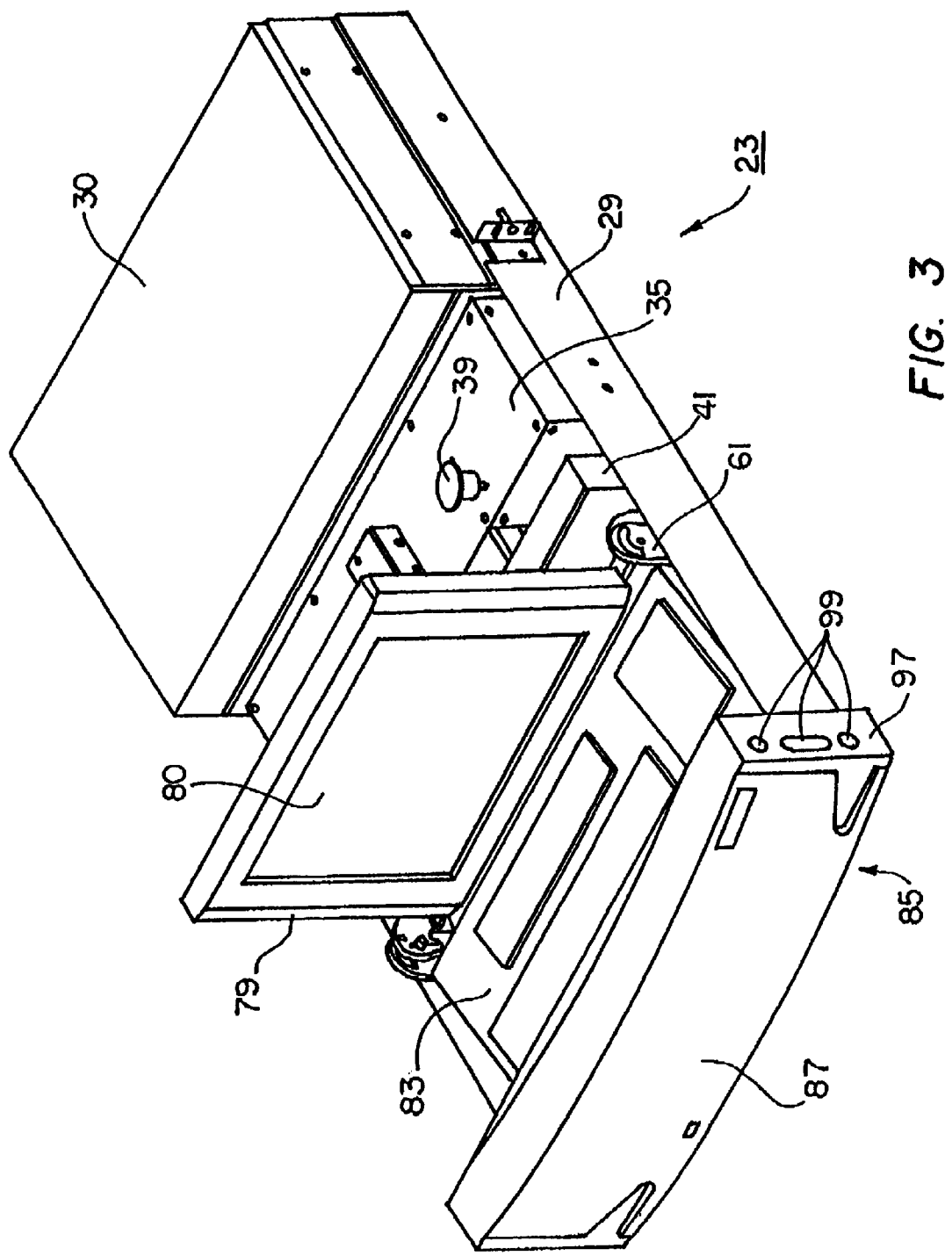
FIG. 3 is a perspective view of the computer console shown in FIG. 2.
Figure 4:
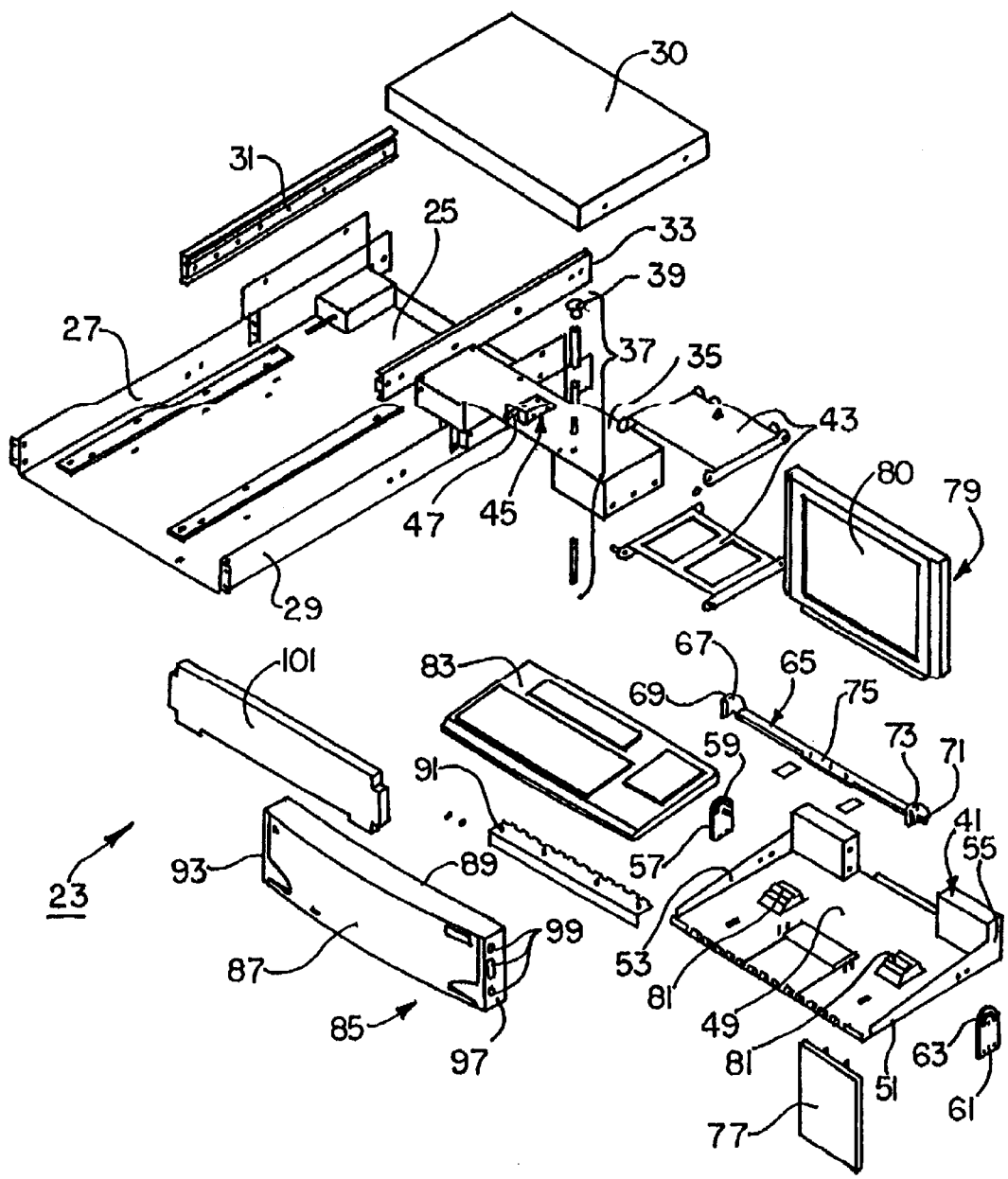
FIG. 4 is an exploded perspective view of the computer console shown in FIG. 2.
Figure 5:
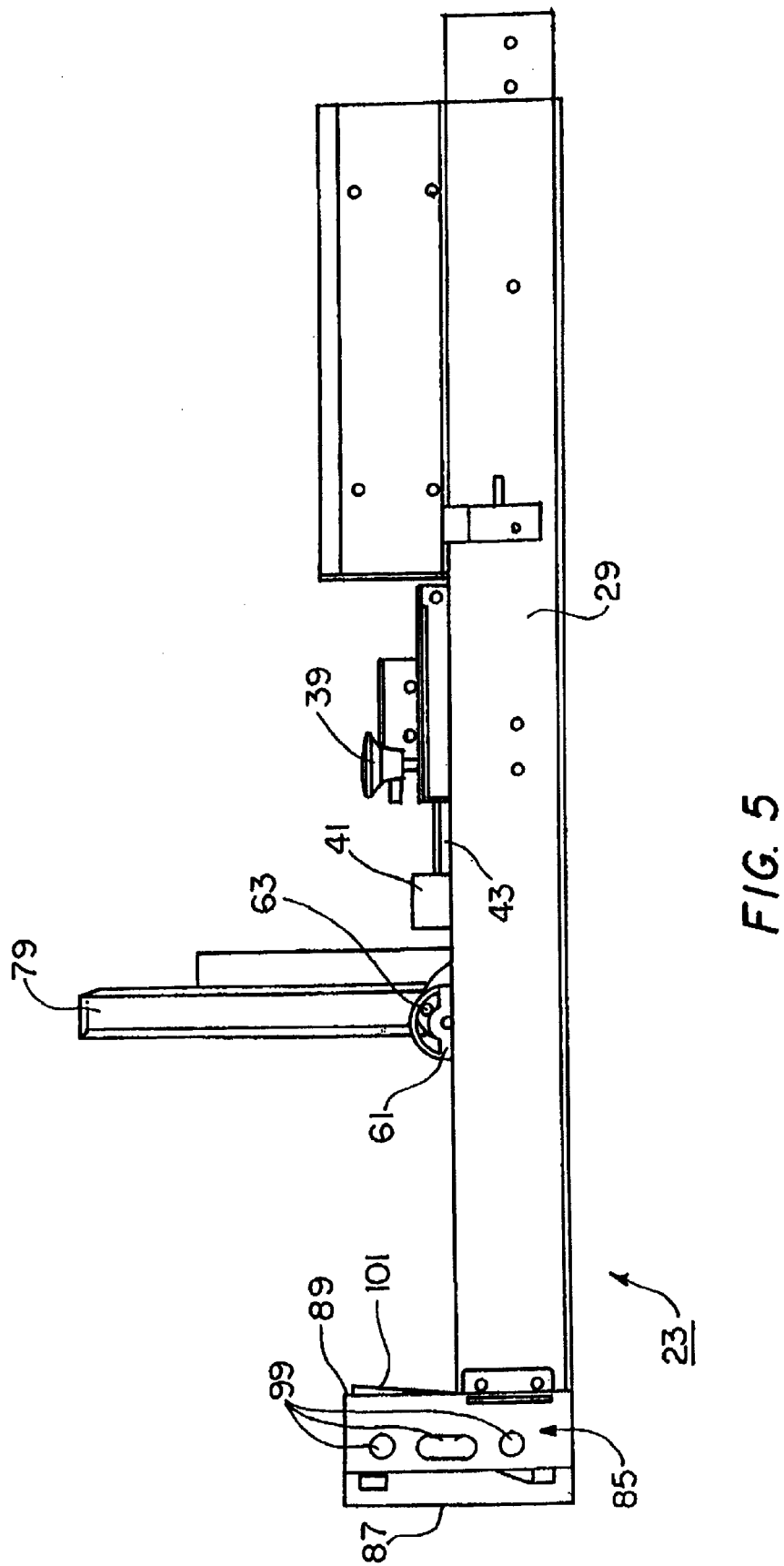
FIG. 5 is a right side view of the computer console shown in FIG. 2.
Figure 6:
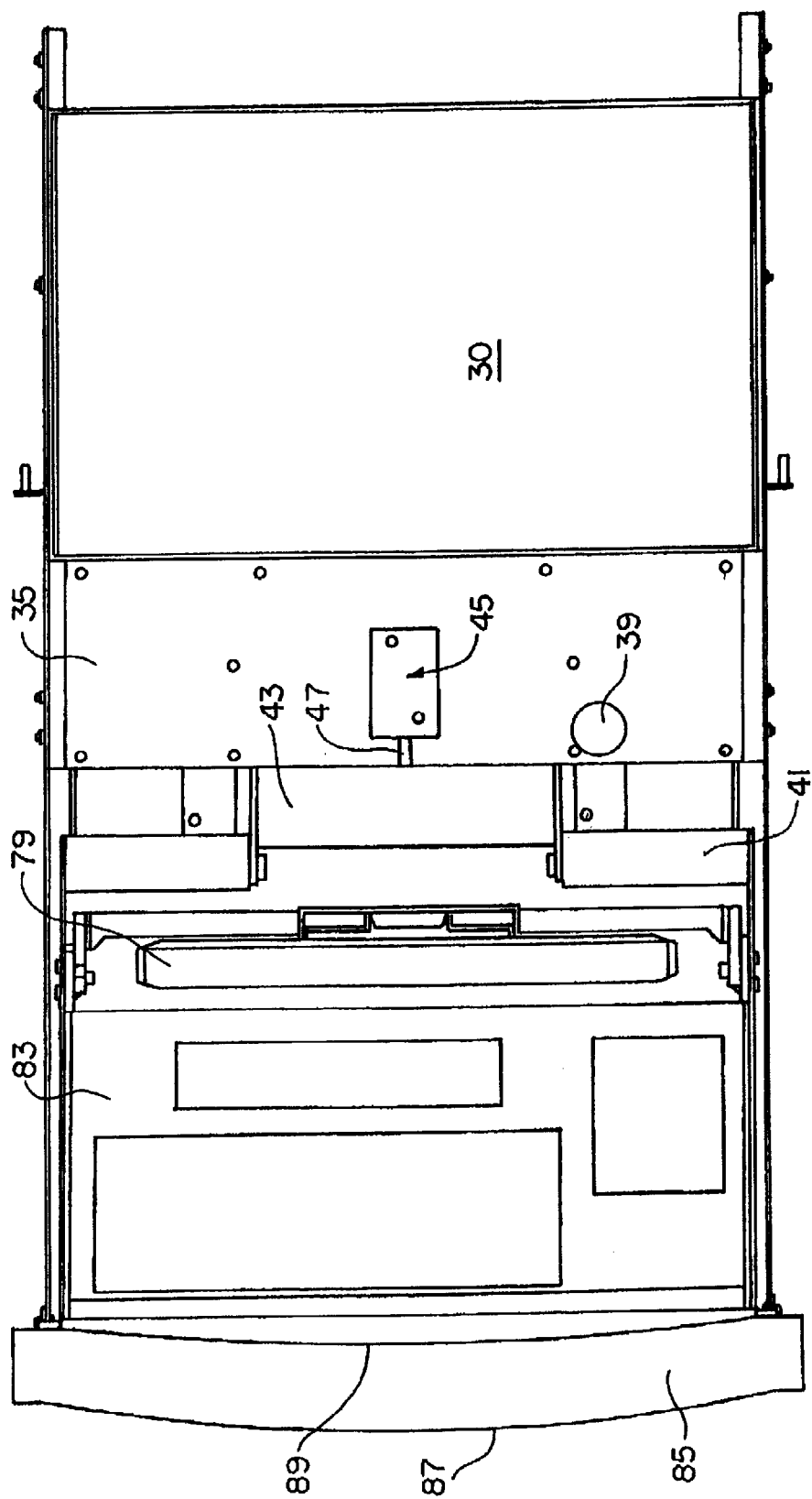
FIG. 6 is a top view of the computer console shown in FIG. 2.
Figure 7:
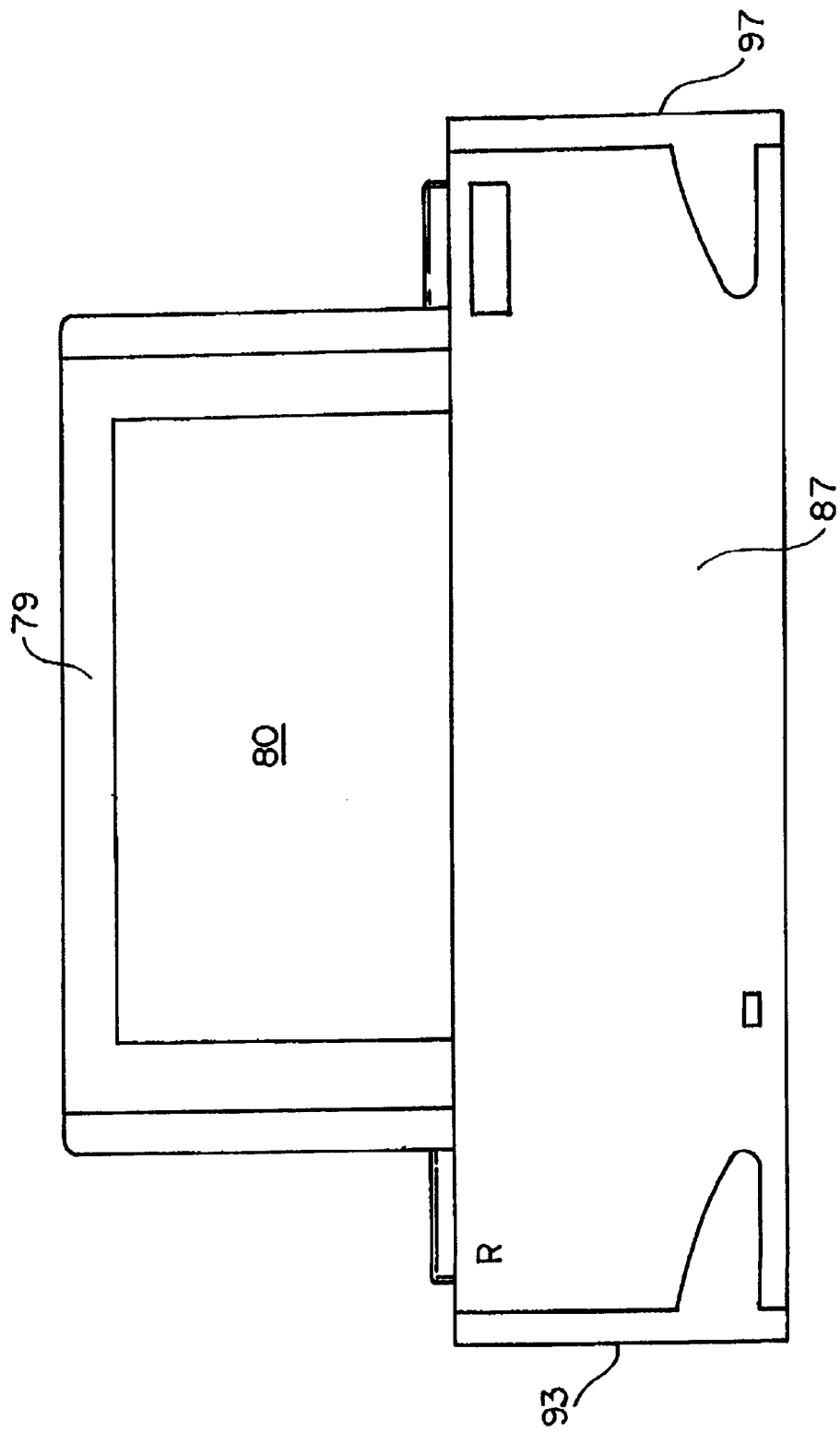
FIG. 7 is a front view of the computer console shown in FIG. 2.
Figure 8:
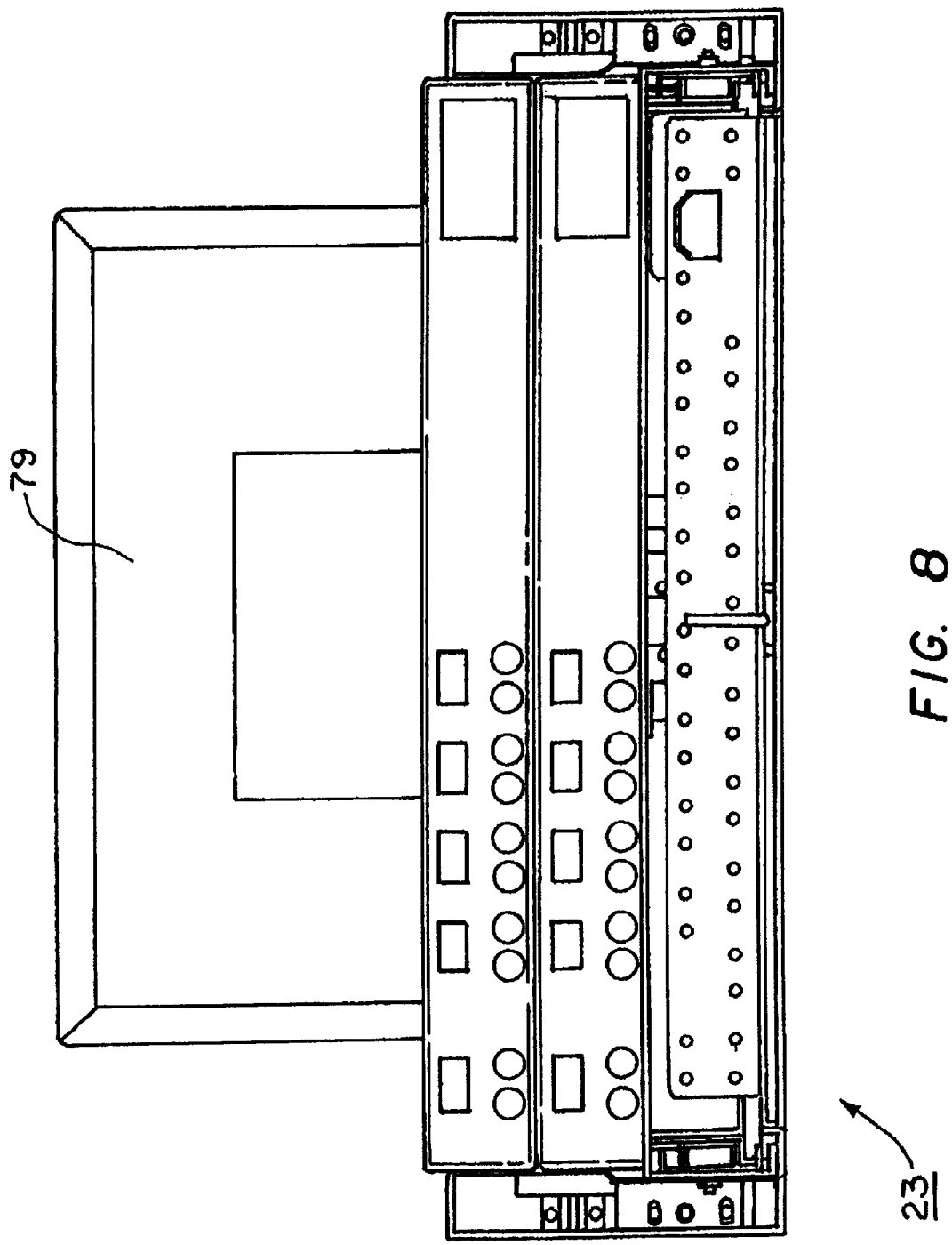
FIG. 8 is a rear view of the computer console shown in FIG. 2.
Figure 9:
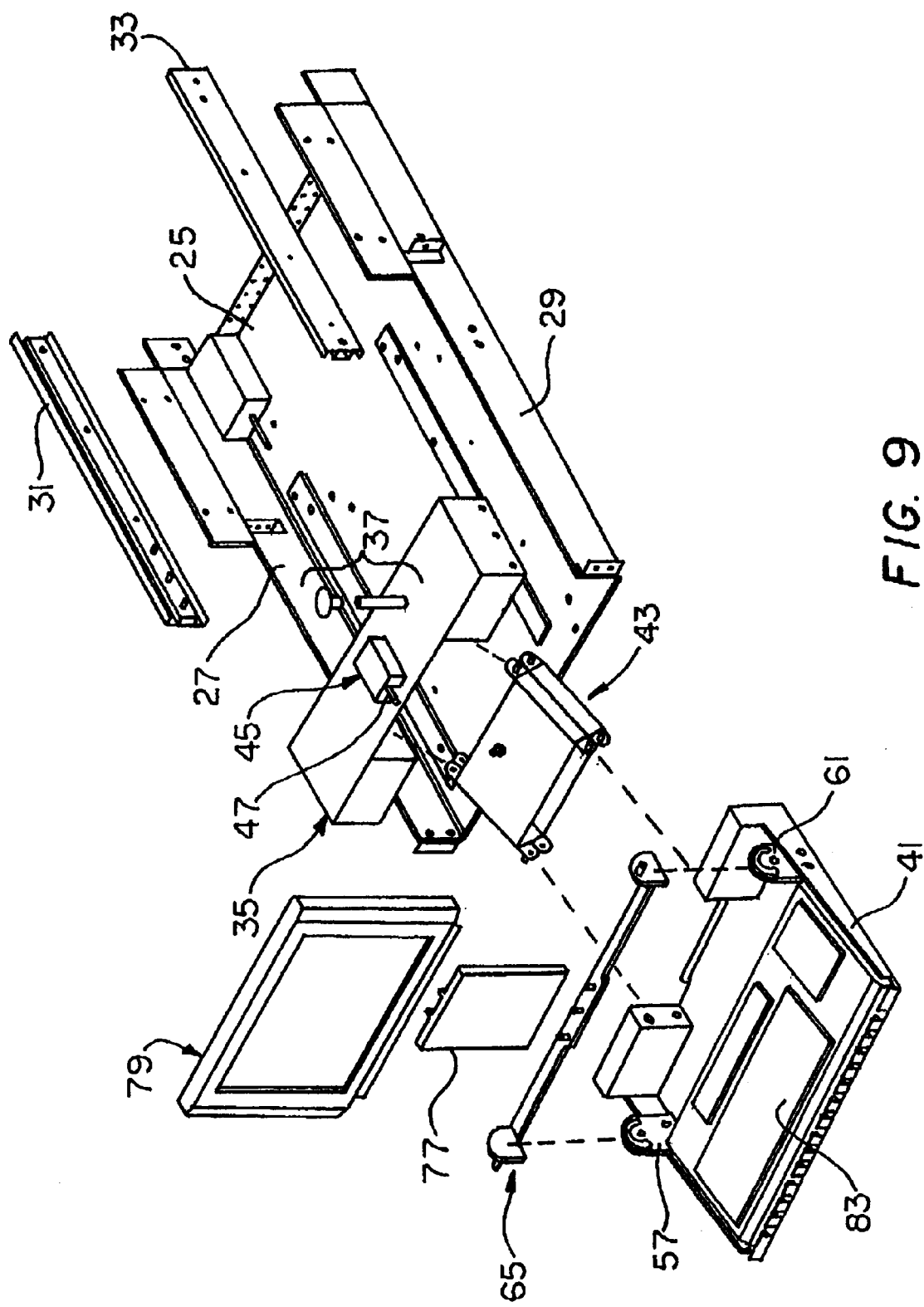
FIG. 9 is an exploded perspective view of selected components of the computer console shown in FIG. 4.
Figure 10:
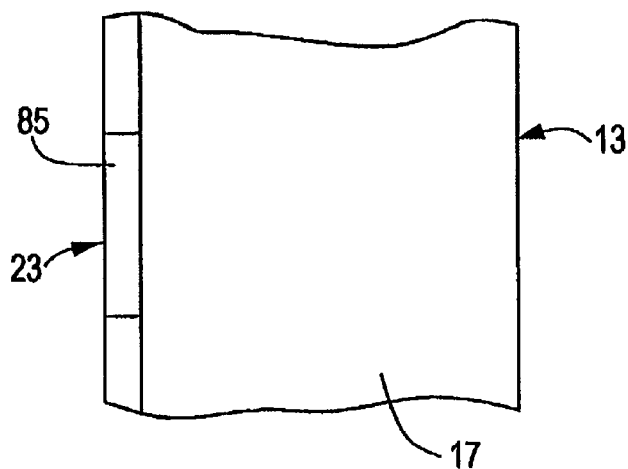
FIG. 10 is a fragmentary, right side view of the rack console assembly shown in FIG. 2, the rack console assembly being shown with the computer console disposed completely inside the rack console.
Figure 11:
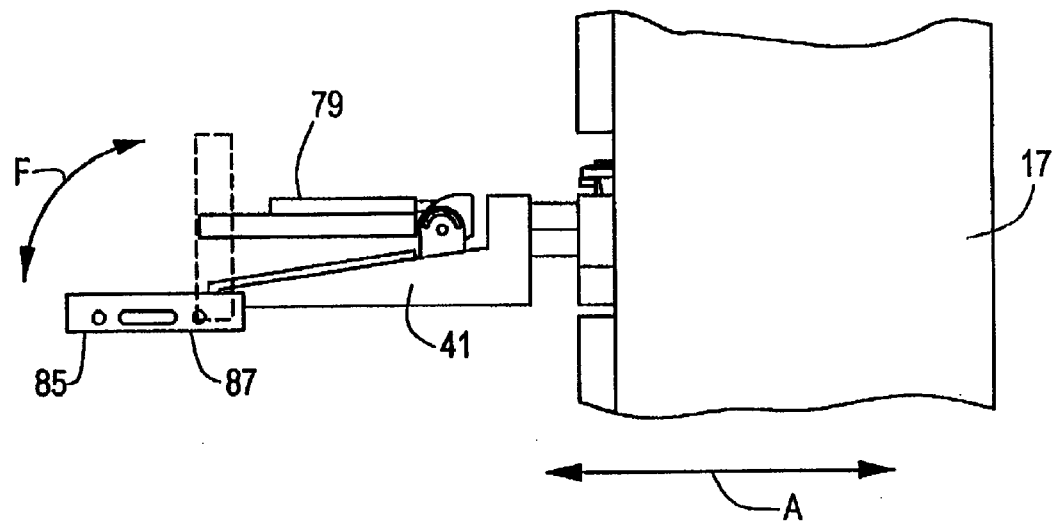
FIG. 11 is a fragmentary, right side view of the rack console assembly shown in FIG. 2, the rack console assembly being shown with the computer console disposed outside the rack console

Referring now to FIGS. 3 and 4, computer console 23 comprises a generally U-shaped tray 25 having a pair of upwardly standing sidewalls 27 and 29. A pair of rail assemblies (not shown) mounted on the inner surface of left and right sidepanels 15 and 17 of rack console 13 slidably engage upwardly standing sidewalls 27 and 29, respectively, of tray 25 so as to enable tray 25 to slide in and out of rack console 13 in a horizontal direction. Specifically, tray 25 is capable of being slid in and out of rack console 13 in a horizontal direction, as represented by arrow A in FIG. 11, between a rear position in which computer console 23 is disposed completely inside rack console 13, as shown in FIG. 10, and a forward position in which selected components of computer console 23 are disposed just outside rack console 13, as shown in FIG. 11. A cover 30 is mounted on sidewalls 27 and 29 of tray 25.

Figure 12:
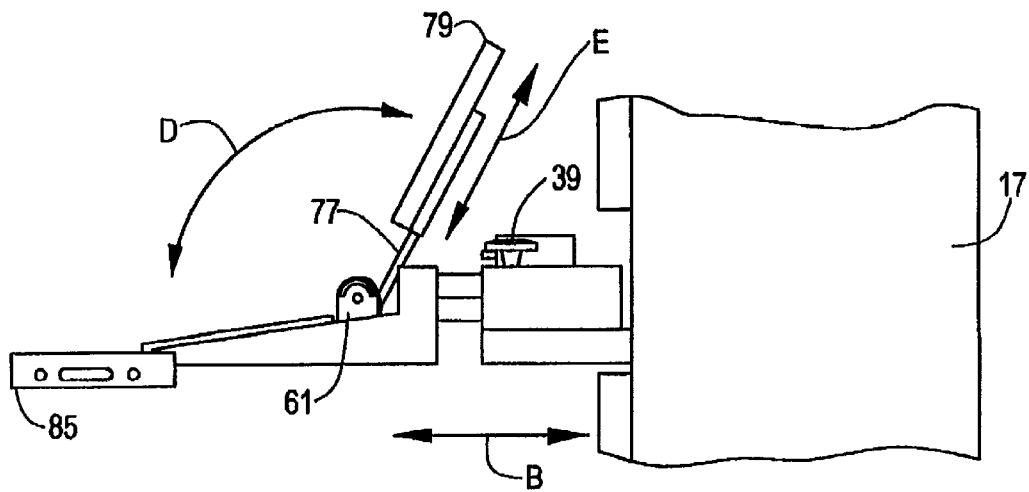
FIG. 12 is a fragmentary, right side view of the rack console assembly shown in FIG. 2, the rack console assembly being shown with the extension block slid forward so as to further extend the frame outside the rack console, the tray being disposed in its upwardmost position relative to the extension block.

Computer console 23 further comprises a pair of frames 31 and 33 which are mounted on upwardly standing sidewalls 27 and 29, respectively, of tray 25 and a slide-out extension block 35 which is slidably mounted on frames 31 and 33. Slide out extension block 35 is mounted on frames 31 and 33 in such a manner so as to enable extension block 35 to slide in a horizontal direction relative to tray 25. Specifically, extension block 35 is capable of being slid along frames 31 and 33 in a horizontal direction, as represented by arrow B in FIG. 12, between the forward position in which selected components of computer console 23 are disposed just outside rack console 13, as shown in FIG. 11, and an extended position in which selected components of computer console 23 are disposed significantly outside rack console 13, as shown in FIG. 12. A knob assembly 37 comprising an enlarged knob 39 is disposed through slide-out extension block 35 and serves to lock and release extension block 35 in different positions along frames 31 and 33.

Figure 13:
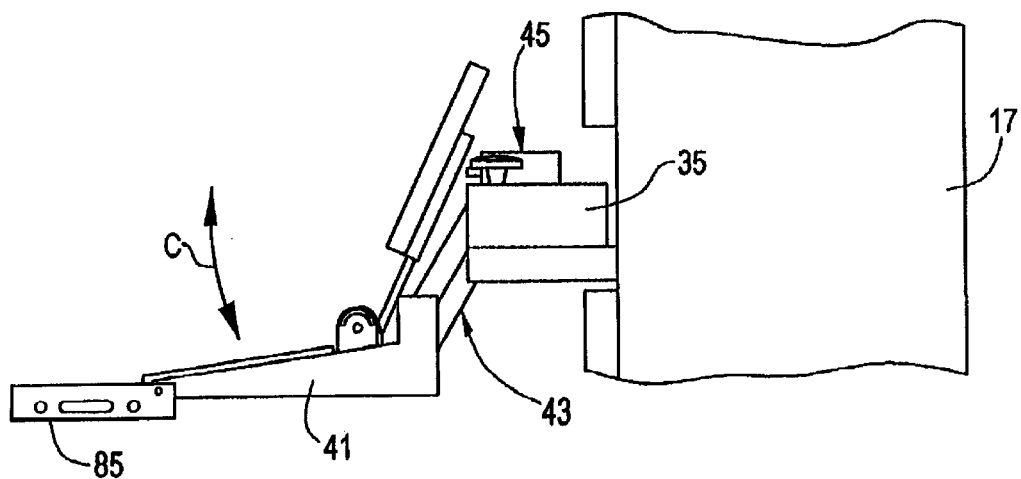
FIG. 13 is a fragmentary, right side view of the rack console assembly shown in FIG. 2, the rack console assembly being shown with the extension block slid forward so as to further extend the frame outside the rack console, the tray being disposed in its lowermost position relative to the extension block.

A metal frame 41 is pivotally connected to slide-out extension block 35 by a pair of spring-biased pivot arms 43. Each of pivot arms 43 are connected at one end to metal frame 41 and at the other end to extension block 35, pivot arms 43 enabling metal frame 41 to pivot in a substantially vertical direction relative to extension block 35. Specifically, frame 41 is capable of being pivoted relative to extension block 35 in a substantially vertical direction, as represented by arrow C in FIG. 13, between an upwardmost position in which frame 41 is disposed at a position that is generally coplanar with extension block 35, as shown in FIG. 12, and a lowermost position in which frame 41 is disposed at a position that is significantly beneath the plane defined by extension block 35, as shown in FIG. 13. A pin assembly 45 comprising a pin 47 is disposed through extension block 35 and in connection with pivot arms 43 and serves to lock and release frame 41 in various vertical positions relative to extension block 35.

Metal frame 41 comprises a top surface 49, a bottom surface 51 and a pair of upwardly standing sidewalls 53 and 55. A first connector bracket 57 having an arcuate opening 59 formed therein is mounted on sidewall 53, such as by a nut and bolt arrangement (not shown). Similarly, a second connector bracket 61 having an arcuate opening 63 formed therein is mounted on sidewall 55, such as by a nut and bolt arrangement (not shown).

A pivotable bracket arm 65 is pivotally mounted on first and second connector brackets 57 and 61. Pivotable bracket arm 65 comprises a first arcuate end piece 67 having an outwardly extending projection 69, a second arcuate end piece 71 having an outwardly extending projection 73 and an elongated arm 75 connected to first arcuate end piece 67 at one end and connected to second arcuate end piece 71 at the other end. Bracket arm 65 is disposed so that outwardly extending projection 69 protrudes through arcuate opening 59 of first connector bracket 57 and so that outwardly extending projection 73 protrudes through arcuate opening 63 of second connector bracket 61. As such, bracket arm 65 is capable of pivotable movement through openings 59 and 63, as represented by arrow D in FIG. 12, between a closed position in which bracket arm 65 is pivoted as far forward as possible, as shown in FIG. 11, and an open position in which bracket arm is pivoted as far backward as possible, as shown in FIG. 12.

A rigid, generally rectangular support member 77 is fixedly mounted on elongated arm 75 of pivotable bracket arm 65 and serves as support means for a flat screen computer monitor 79. Specifically, flat screen computer monitor 79 includes an enlongated slot (not shown) formed therein which is sized and shaped to enable support member 77 to fit snugly therewithin. Computer monitor 79 is mounted on support member 77 in such a manner that computer monitor 79 is capable of movement on support member 77 in a vertical direction relative to connective bracket arm 75. Specifically, computer monitor 79 is capable of being slid along support member 77, as represented by arrow E in FIG. 12, between a retracted position in which monitor 79 is disposed in close proximity to bracket arm 65, as shown in FIG. 11, and an extended position in which monitor 79 is spaced significantly away from bracket arm 65, as shown in FIG. 12.

Top surface 49 of metal frame 41 is shaped to include a pair of cut-out tab projections 81 on which a computer keyboard 83 is disposed. Keyboard 83 is removably secured onto tab projections 81 of metal frame 41 such as by hook and pile type fasteners.

An end panel 85 having an outer surface 87 and an inner surface 89 is pivotally mounted onto metal frame 41 by a hinge 91. End panel 85 comprises a first sidewall 93 having a plurality of finger-gripping indentations (not shown) and a second sidewall 97 having a plurality of finger-gripping indentations 99. A rectangular pad 101 constructed of a soft material, such as foam, is mounted on the inner surface 89 of end panel 85. It should be noted that end panel 85 is capable of being pivoted relative to frame 41, as represented by arrow F in FIG. 11. Specifically, end panel 85 is pivotally mounted onto metal frame 41 so that rectangular pad 101 can be positioned in a substantially perpendicular relation with top surface 49 of metal frame 41, such as when computer console 23 is in its non-operating mode, and so that rectangular pad 101 can be positioned in a substantially parallel relation with top surface 49 of metal frame 41, such as when computer console 23 is in its operating mode.

In use, computer console 23 can be accessed from rack console 13 in the following manner. When in its non-operating mode, computer console 23 is disposed entirely within rack console 13 with end panel 85 is orientated in a substantially perpendicular position in relation to top surface 49 of metal frame 41 so as to protect computer console 23, as shown in FIGS. 1 and 10. It should be noted that the particular construction of rack console assembly 11 enables computer console 23 to be collapsably disposed within rack console 13 so as to occupy the space designated for only a single 19 inch, 3-U component.

In its operating mode, computer console 23 can be slidably withdrawn from rack console 13 and accessed for use. Specifically, the operator grasps fingergripping indentations 95 and 99 of end panel 85 and slides computer console 23 so that tray 25 moves horizontally out from rack console 13 until computer console 23 is positioned outside of rack console 13. The operator can further horizontally extend frame 41 out away from rack console 13 by lifting knob 39, as shown in FIG. 12. Lifting knob 39 enables slide-out extension block 35 to slide in a horizontal direction out away from tray 25.

With computer console 23 positioned outside of rack console 13, the operator pivots computer monitor 79 towards rack console 13 as shown by arrow D in FIG. 12, until a screen display 80 for monitor 79 is located at a favorable position for viewing. Monitor 79 can be slid along support member 77, as shown by arrow E in FIG. 12, to further assist the operator in viewing screen display 80.

End panel 85 is then pivoted downward relative to metal frame 41 as shown by arrow F in FIG. 11. so that rectangular pad 93 is positioned in a substantially parallel relation with top surface 49 of metal frame 41. Positioned as such, rectangular pad 93 serves as a handrest during the operation of keyboard 83.

With computer console 23 withdrawn from rack console 13 in the manner noted above, keyboard 83 and monitor 79 are positioned at a height that is designed to accommodate an operator who is in a standing position. However, it is to be noted that keyboard 83 and monitor 79 can be lowered to a height that is designed to accommodate an operator who is in a sitting position. Specifically, actuation of pin 47 causes metal frame 41, and accordingly keyboard 83 and monitor 79, to pivot downward from extension block 35 as shown by errow C in FIG. 13. to a level more suitable for an operator who is in a sitting position.

The embodiment shown in the present invention is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A rack console assembly comprising:
    (a). a rack console, and
    (b). a computer console slidably disposed within said rack console, wherein said computer console is adapted to be collapsably disposed inside of said rack console when in its non-operating mode and said computer console is adapted to be openly disposed outside of said rack console when in its operating mode, said computer console comprising,
        (i). a metal frame mounted onto said rack console, said metal frame being adapted to be vertically and horizontally displaced relative to said rack console,
        (ii). a computer monitor mounted on said metal frame, and
        (iii). a computer keyboard mounted on said metal frame.

2. The rack console assembly of claim 1 wherein said computer console comprises a tray slidably disposed within said rack console and an extension block slidably mounted on said tray.

3. The rack console assembly of claim 2 wherein said frame is pivotally connected to said extension block by a pivot arm.

4. The rack console assembly of claim 3 wherein said computer monitor is mounted on a bracket arm which is pivotally mounted on said frame.

5. The rack console assembly of claim 4 wherein said computer monitor is slidably mounted on a support member which is fixedly mounted on said bracket arm, said computer monitor being capable of vertical displacement along said support member.

6. The rack console assembly of claim 5 wherein said computer console comprises an end panel pivotally mounted on said frame, said end panel having an inner surface and an outer surface.

7. The rack console assembly of claim 6 wherein said computer console comprises a handrest pad affixed to the inner surface of said end panel.

8. A rack console assembly comprising:
  (a). a rack console, and
  (b). a computer console slidably disposed within said rack console, said computer console comprising,
    (i). a tray slidably disposed within said rack console, said tray being adapted to be horizontally displaced relative to said rack console,
    (ii). an extension block slidably mounted on said tray, said extension block being adapted to be horizontally displaced relative to said tray,
    (iii). a metal frame pivotally mounted on said extension block, said metal frame being adapted to be vertically displaced relative to said extension block,
    (iv). a computer monitor mounted on said metal frame, and
    (v). a computer keyboard mounted on said metal frame.

9. The rack console assembly of claim 8 wherein said extension block is slidably mounted on a pair of frames which are fixedly mounted onto said tray.

10. The rack console assembly of claim 8 further comprising a knob assembly for releasably locking said extension block at different positions relative to said tray.

11. The rack console assembly of claim 8 wherein said frame is fixedly mounted on a pair of spring biased pivot arms which are pivotally mounted on said extension block.

12. The rack console assembly of claim 8 further comprising a pin assembly for releasably locking said frame at different positions relative to said extension block.

13. The rack console assembly of claim 8 wherein said computer monitor is adapted to be vertically and pivotally displaced relative to said metal frame.

14. The rack console assembly of claim 8 further comprising,
  (a). a bracket arm pivotally mounted onto said metal frame, and
  (b). a support member fixedly mounted onto said bracket arm,
  (c). wherein said computer monitor is slidably mounted on said support member so as to enable said computer monitor to be vertically displaced relative to said support member.

15. The rack console assembly of claim 8 wherein said computer keyboard is mounted on tab projections formed on said metal frame.

16. The rack console assembly of claim 8 further comprising an end panel pivotally mounted on said metal frame, said end panel having an inner surface, an outer surface and a pair of sidewalls.

17. The rack console assembly of claim 14 wherein said bracket arm is pivotally mounted onto a pair of connector brackets which are fixedly mounted on said metal frame.

18. The rack console assembly of claim 16 wherein each of the pair of sidewalls of said end panel includes finger gripping indentations.

19. The rack console assembly of claim 16 further comprising a pad mounted on the inner surface of said end panel.

* * * * *